(12) United States Patent
Okumura (10) Patent No.: US 9,691,593 B2
(45) Date of Patent: Jun. 27, 2017

(54) PLASMA PROCESSING DEVICE AND PLASMA PROCESSING METHOD

(71) Applicant: Panasonic Corporation, Osaka (JP)

(72) Inventor: Tomohiro Okumura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 371 days.

(21) Appl. No.: 14/337,221

(22) Filed: Jul. 22, 2014

(65) Prior Publication Data

US 2015/0136735 A1    May 21, 2015

(30) Foreign Application Priority Data

Nov. 18, 2013   (JP) ................................ 2013-237626

(51) Int. Cl.
| | |
|---|---|
| *B23K 10/00* | (2006.01) |
| *H01J 37/32* | (2006.01) |
| *C23C 16/24* | (2006.01) |
| *C23C 16/40* | (2006.01) |
| *C23C 16/455* | (2006.01) |
| *C23C 16/513* | (2006.01) |

(52) U.S. Cl.
CPC ........ *H01J 37/32522* (2013.01); *C23C 16/24* (2013.01); *C23C 16/401* (2013.01); *C23C 16/45595* (2013.01); *C23C 16/513* (2013.01); *H01J 37/3211* (2013.01); *H01J 37/32467* (2013.01)

(58) Field of Classification Search
CPC ............. H01J 37/32522; H01J 37/3211; H01J 37/32467; C23C 16/24; C23C 16/401; C23C 16/45595; C23C 16/513; H05H 1/28; H05H 1/30

USPC .......................... 219/121.43, 121.48, 121.51
See application file for complete search history.

(56) References Cited

U.S. PATENT DOCUMENTS

| | | | |
|---|---|---|---|
| 2012/0058649 A1 | 3/2012 | Okumura et al. | |
| 2012/0115317 A1 | 5/2012 | Okumura et al. | |
| 2012/0279658 A1 | 11/2012 | Bolden, II et al. | |

(Continued)

FOREIGN PATENT DOCUMENTS

| | | |
|---|---|---|
| JP | 2008-041495 | 2/2008 |
| JP | 2010-251708 | 11/2010 |

(Continued)

OTHER PUBLICATIONS

"Elongated Inductively Coupled Thermal Plasma Torch Operable at Atmospheric Pressure", Tomohiro Okumura and Hiroshi Kawaura, Jpn. J. Appl. Phys. 52 (2013) 05EE01.

(Continued)

*Primary Examiner* — Mark Paschall
(74) *Attorney, Agent, or Firm* — Panasonic IP Management; Kerry S. Culpepper (57) ABSTRACT

To provide a plasma processing device and a plasma processing method capable of performing high-speed processing. In an inductively-coupled plasma torch unit, a coil, a lid and a first ceramic block are bonded together, and a long chamber has an annular shape. Plasma generated in the chamber is ejected from an opening in the chamber toward a substrate. The substrate is processed by moving the long chamber and the substrate mounting table relatively in a direction perpendicular to a longitudinal direction of the opening. The first ceramic block is cooled efficiently by allowing a refrigerant to flow in a refrigerant flow path.

8 Claims, 9 Drawing Sheets

(56) References Cited

U.S. PATENT DOCUMENTS

| | | |
|---|---|---|
| 2013/0105085 A1 | 5/2013 | Yousif et al. |
| 2013/0115780 A1 | 5/2013 | Okumura et al. |
| 2013/0230990 A1 | 9/2013 | Okumura et al. |
| 2014/0094040 A1 | 4/2014 | Okumura et al. |
| 2014/0220784 A1 | 8/2014 | Okumura et al. |

FOREIGN PATENT DOCUMENTS

| | | |
|---|---|---|
| JP | 2012-104578 | 5/2012 |
| JP | 2012-174500 | 9/2012 |
| JP | 2013-093266 | 5/2013 |
| JP | 2013-120633 | 6/2013 |
| JP | 2013-120684 | 6/2013 |
| JP | 2013-120685 | 6/2013 |
| JP | 2013-211244 | 10/2013 |
| TW | 201330047 | 7/2013 |

OTHER PUBLICATIONS

English Translation of Taiwan Search Report dated Jan. 14, 2016 for the related Taiwan Patent Application No. 103138356.

PLASMA PROCESSING DEVICE AND PLASMA PROCESSING METHOD

BACKGROUND OF THE INVENTION

1. Field of the Invention

The present invention relates to a plasma processing device and a plasma processing method used for thermal plasma processing which processes a substrate by irradiating the substrate with thermal plasma, a low-temperature plasma processing which processes the substrate by irradiating the substrate with plasma by a reactive gas or with plasma and a reactive gas flow at the same time and other processing.

2. Description of Related Art

A semiconductor thin film such as polycrystalline silicon (poly-Si) is widely used for a thin-film transistor (TFT) and a solar cell in related art. As a method of forming the semiconductor thin film inexpensively, there is a method of irradiating an amorphous silicon film with laser light to crystallize the film. The laser process can be also applied to activation of impurity atoms implanted into a semiconductor substrate by ion implantation or plasma doping. However, the crystallization technique using laser has problems such as occurrence of a seam, and further, extremely expensive equipment is necessary.

Accordingly, a technique of performing heat treatment without a seam inexpensively by generating long thermal plasma and performing scanning only in one direction has been examined (for example, refer to JP-A-2013-120633 (Patent Document 1), JP-A-2013-120684 (Patent Document 2) and JP-A-2013-120685 (Patent Document 3) as well as Non-patent document 1 below).
[Non-Patent Document 1] T. Okumura and H. Kawaura, Jpn. J. Appl. Phys. 52 (2013) 05EE01

SUMMARY OF THE INVENTION

However, for the purposes of performing high-temperature processing to the vicinity of a surface of a substrate for a very short period of time such as in crystallization of semiconductor, high-frequency power giving the temperature limit of components of a plasma torch is relatively low in the technique of generating thermal plasma to be long as disclosed in Patent Documents 1 to 3 and Non-Patent Document 1 shown as related-art examples, therefore, there is a problem that processing speed (the number of substrates which can be processed per a unit time) is low.

The present invention has been made in view of the above problem, and an object thereof is to provide a plasma processing device and a plasma processing method capable of performing processing at high speed when performing high-temperature heat treatment uniformly to the vicinity of the surface of the substrate for a very short period of time, or when performing low-temperature plasma processing to the substrate by irradiating the substrate with plasma by a reactive gas or with plasma and the reactive gas flow at the same time.

According to an embodiment of the present invention, there is provided a plasma processing device including a long annular chamber surrounded by a dielectric member, an opening communicated to the chamber, a gas supply pipe for introducing gas into the chamber, a coil provided in parallel to a surface formed by the chamber, a high-frequency power source connected to the coil, and a substrate mounting table. In the plasma processing device, the chamber is provided along a surface perpendicular to a surface formed by the substrate mounting table, and a refrigerant flow path is provided inside the dielectric member inside the chamber.

Due to the above structure, high speed processing can be performed.

Also according to the embodiment of the present invention, there is provided a plasma processing method ejecting a gas toward a substrate from an opening communicated to a chamber while supplying the gas into a long annular chamber provided along a surface perpendicular to a surface formed by a substrate mounting table and surrounded by a dielectric member as well as generating a high-frequency electromagnetic field in the chamber by supplying high-frequency power to a coil provided in parallel to a surface formed by the chamber to thereby generate plasma to process a surface of the substrate.

The method includes the step of processing the substrate while allowing a refrigerant to flow in a refrigerant flow path provided inside the dielectric member inside the chamber.

Due to the above structure, high speed processing can be performed.

According to the embodiment of the present invention, high speed processing can be performed when performing high-temperature heat treatment uniformly to the vicinity of the surface of the substrate for a very short period of time, or when performing plasma processing to the substrate by irradiating the substrate with plasma by a reactive gas or with plasma and the reactive gas flow at the same time.

DESCRIPTION OF PREFERRED EMBODIMENTS

Hereinafter, a plasma processing device according to an embodiment of the present invention will be explained with reference to the drawings.

Embodiment 1

Embodiment 1 of the present invention will be explained below with reference to FIGS. 1A to 1C to FIG. 3.

Figure 1A:
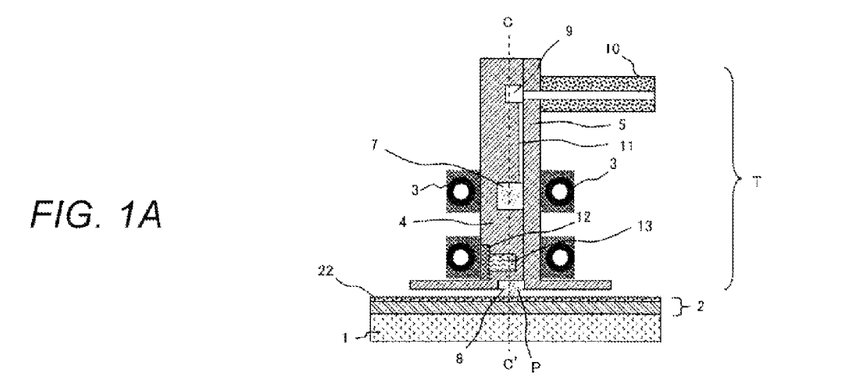
FIGS. 1A to 1C are cross-sectional views showing a structure of a plasma processing device according to Embodiment 1 of the present invention.
Figure 1B:
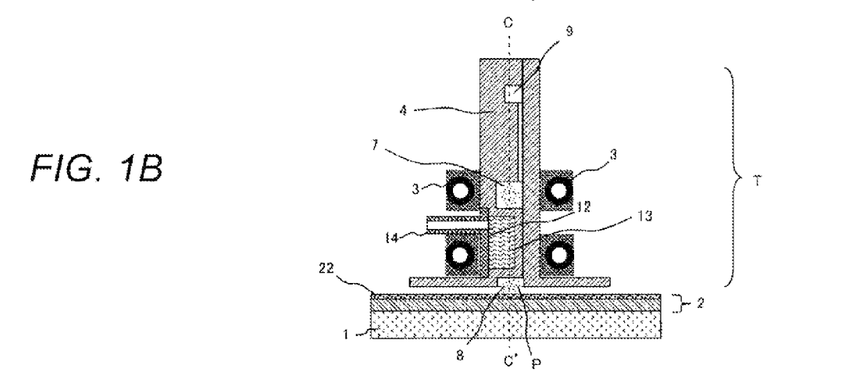
Figure 1C:
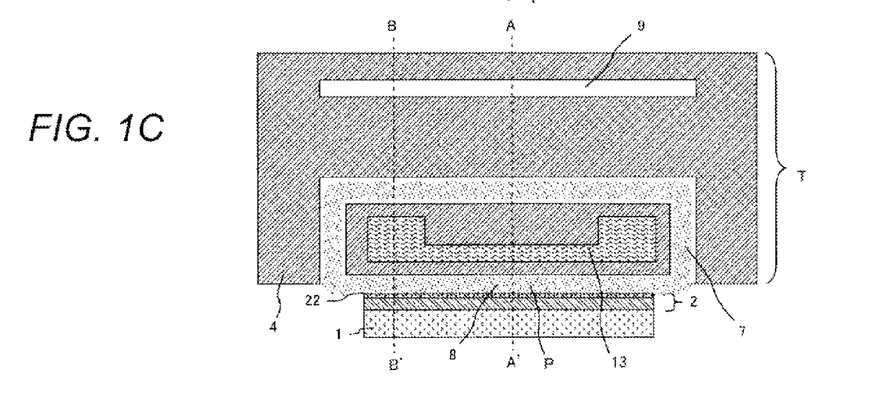

FIGS. 1A and 1B show a structure of a plasma processing device according to Embodiment 1 of the present invention, which are cross-sectional views taken along a surface perpendicular to a longitudinal direction of a long inductively-coupled plasma torch unit. FIG. 1C is a cross-sectional view taken along a surface parallel to the longitudinal direction of the inductively-coupled plasma torch unit as well as perpendicular to a substrate. FIG. 1A is a cross-sectional view taken along a dashed line A-A' of FIG. 1C, FIG. 1B is a cross-sectional view taken along a dashed line B-B' of FIG. 1C and FIG. 1C is a cross-sectional view taken along a dashed line C-C' of FIG. 1A and FIG. 1B.

In FIGS. 1A and 1C, a substrate 2 is mounted on a substrate mounting table 1. In an inductively-coupled plasma torch unit T, coils 3 made of conductors are disposed in the vicinity of a first ceramic block 4 and a second ceramic block 5. The coils 3 are bonded to the first ceramic block 4 and the second ceramic block 5 by a not-shown adhesive, and the coils 3 bonded to respective blocks are arranged opposite to each other in parallel and are connected in series. A long chamber 7 is defined by a space surrounded by the first ceramic block 4, the second ceramic block 5 and the substrate 2.

The coils 3 and the chamber 7 are disposed along a surface perpendicular to a surface formed by the substrate mounting table 1. An inner wall surface of the chamber 7 in a side closer to the coil 3 is a surface parallel to the coil 3. In such structure, distances between the coil 3 and the chamber 7 are equivalent in arbitrary portions of the coil 3, therefore, inductively-coupled plasma can be generated with small high-frequency power, and efficient plasma generation can be realized.

The inductively-coupled plasma torch unit T is surrounded by a shield member (not shown) made of a conductor which is entirely grounded, capable of preventing leakage of high frequency (noise) efficiently as well as preventing undesirable abnormal discharge.

The chamber 7 is surrounded by an annular groove continuously formed in the first ceramic block 4. That is, the entire chamber 7 is surrounded by a dielectric. The chamber 7 has an annular shape. The annular shape means, in this case, a closed continuous string shape, and is not limited to a rectangular shape as shown in FIG. 1C. In the present embodiment, the chamber 7 having a race-track shape (closed continuous string shape in which straight portions forming two long sides and straight lines forming two short sides are connected to both ends) is shown as an example. Plasma P generated in the chamber 7 is ejected from a plasma ejection port as an opening 8 in the chamber 7 toward the substrate 2. The longitudinal direction of the chamber 7 is disposed in parallel to the longitudinal direction of the opening 8 as the plasma ejection port.

A rectangular groove provided in the first ceramic block 4 is a plasma gas manifold 9. A porous ceramic material may be fitted thereto. The gas supplied from a plasma gas supply pipe 10 to the plasma gas manifold 9 is introduced to the chamber 7 through a plasma gas supply hole 11 (through hole) as a gas introducing portion provided in the first ceramic block 4. According to the structure, the gas flow which is uniform in the longitudinal direction can be easily realized. A flow amount of gas to be introduced to the plasma gas supply pipe 10 is controlled by providing a flow controller such as a mass-flow controller in the upstream. As the porous ceramic material is used in the plasma manifold 9, the uniform gas flow can be realized as well as abnormal discharge in the vicinity of the plasma gas manifold 9 can be prevented.

The plasma supply hole 11 is constructed by forming plural round holes in the longitudinal direction, or may be constructed by forming a long slit-shaped hole in the longitudinal direction.

It is also preferable to arrange a shielding gas nozzle as a shielding gas supply port in a position close to the substrate mounting table 1, though not shown. The shielding gas is supplied in addition to the plasma gas suitable for generating plasma, thereby reducing the mixture of gas which is not necessary for processing or adversely affects the processing such as oxygen and carbon dioxide in the atmosphere to a plasma irradiation surface. The shielding gas supply port may be a slit having a shape elongated in a direction parallel to the longitudinal direction of the opening 8, or may be many holes aligned in the direction parallel to the longitudinal direction of the opening 8.

Figure 2:
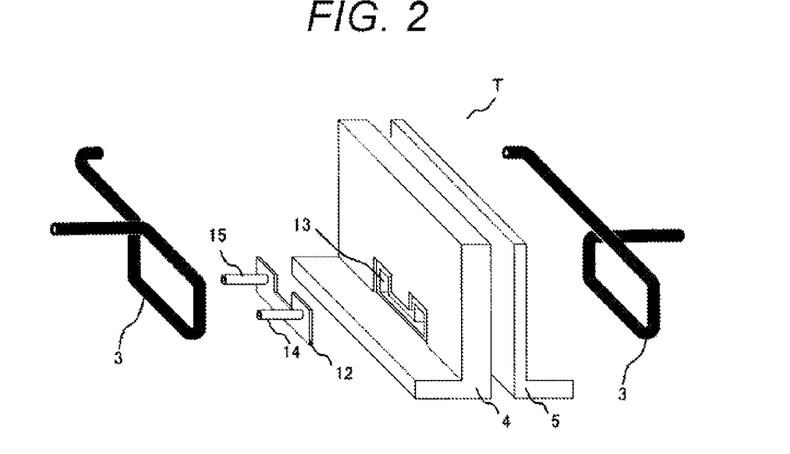
FIG. 2 is a perspective view showing the structure of the plasma processing device according to Embodiment 1 of the present invention.
Figure 3:
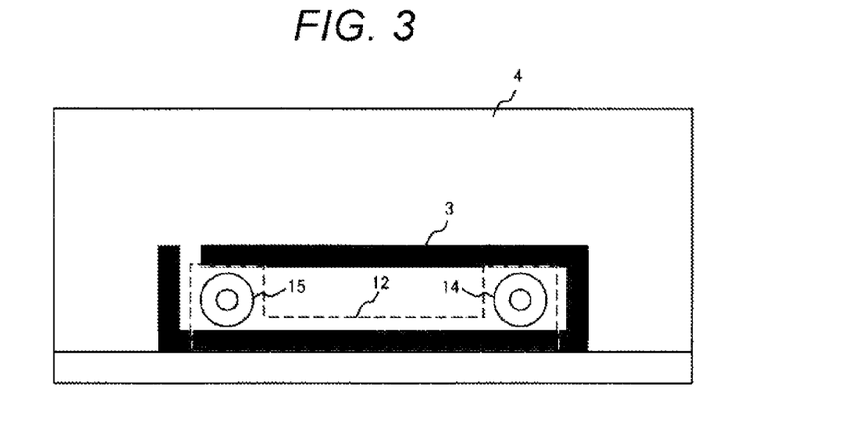
FIG. 3 is a plan view showing the structure of the plasma processing device according to Embodiment 1 of the present invention.

The coil 3 is formed by bonding a copper pipe having a circular shape in cross section to a copper block having a rectangular parallelepiped shape in cross section. The coil 3 is a hollow tube, and the inside of the tube is a flow path for refrigerant. That is, cooling can be performed by allowing the refrigerant such as water to flow. In the first ceramic block 4, a U-shaped refrigerant flow path 13 closed by a lid 12 made of a dielectric is formed. FIG. 2 is an assembly structure view of the inductively-coupled plasma torch unit T according to Embodiment 1 of the present invention, in which perspective views of respective parts (portions) are aligned. As shown in FIG. 1B and FIG. 2, a refrigerant entrance 14 and a refrigerant exit 15 with respect to the refrigerant flow path 13 are disposed inside a ring formed by the coil 3. The lid 12 is fitted to a counterbored portion provided in the first ceramic block 4 to prevent the occurrence of a step on a surface to which the coil 3 is bonded when the lid 12 is bonded to the first ceramic block 4. FIG. 3 is a plan view showing the structure of the plasma processing device according to Embodiment 1 of the present invention, which is obtained by seeing the coil 3 and the first ceramic block 4 from the left side of FIG. 2. An outer periphery of the lid 12 is shown by a dotted line in FIG. 3. As shown in FIG. 3, the refrigerant entrance 14 and the refrigerant exit 15 are connected to both ends of the U-shaped lid 12, which are arranged so as to pierce the inside of the annular region formed by the coil 3.

In this case, silicon nitride is used for the first ceramic block 4. As excellent heat resistance is required for portions contacting the plasma P, ceramic materials mainly containing silicon nitride, or ceramic materials mainly containing silicon, aluminum, oxygen and nitrogen (Sialon and the like) are suitable. A portion receiving the highest heat quantity when the distance between the inductively-coupled plasma torch unit T and the substrate 2 is reduced for processing the substrate 2 efficiently is an inner wall surface of a portion of the chamber 7 near the substrate mounting table 1, which is opposite to the substrate mounting table 1. Accordingly, it is necessary to cool the portion effectively. When the inner wall surface of the chamber 7 is cooled by using the water-cooled coils 3 as an only cooling means, it may be appropriate that the first ceramic block 4 is formed to be as thin as possible and that the coils 3 are arranged as close as possible to the inner wall surface, however, such structure may cause dielectric breakdown in the first ceramic block 4 and abnormal discharge (arc) may occur between the coil 3 and the plasma. Accordingly, in the Embodiment, the refrigerant flow path 13 as the cooling means is provided in addition to the coil 3, which functions not only as the cooling means but also as an insulator (securing the distance between the coil and the chamber 7).

On the other hand, it is necessary to arrange the coil 3 in a position as close as possible to the substrate mounting table 1, that is, a lower position in FIG. 1A and FIG. 1B for increasing discharge efficiency. That is, in order to realize both high efficiency of plasma generation and high efficiency of cooling, it is necessary to arrange the coil 3 and the refrigerant flow path 13 to be close to each other. Accordingly, the arrangement of pipes for supplying/discharging the refrigerant with respect to the refrigerant flow path 13 has to be devised. The problem is solved in the embodiment by forming the refrigerant flow path 13 to have a U-shape and connecting the refrigerant entrance 14 and the refrigerant exit 15 to both ends of the U-shaped lid 12 so as to pierce the inside of the annular region formed by the coil 3. In short, the application of such arrangement realizes higher cooling efficiency by the simple piping system while securing the plasma generation efficiency equivalent to the one disclosed in Non-Patent Document 1 in related art. Consequently, as the high frequency power giving the temperature limit of components of the plasma torch can be increased, processing speed (the number of substrates which can be processed per a unit time) can be increased.

The rectangular opening 8 is provided, and the substrate mounting table 1 (or the substrate 2 on the substrate mounting table 1) is arranged opposite to the opening 8. The high frequency power is supplied to the coils 3 from a not-shown high-frequency power source while supplying the plasma gas into the chamber 7 and ejecting the gas from the opening 8 toward the substrate 2 in the above state, thereby generating the plasma P in the chamber 7 and irradiating the substrate 2 with the plasma from the opening 8, as a result, the plasma processing can be performed to the thin film 22 on the substrate 2. The substrate 2 is processed by moving the chamber 7 and the substrate mounting table 1 relatively in a direction perpendicular to the longitudinal direction of the opening 8. That is, the inductively-coupled plasma torch unit T or the substrate mounting table 1 is moved in a right and left direction of FIGS. 1A and 1B.

Various kinds of gases can be used as the plasma gas to be supplied to the chamber 7, but it is desirable to use inert gases, particularly desirable to mainly use noble gases when considering stability and ignition performance of plasma, lifetime of members exposed to plasma and so on. Among them, Ar gas is typically used. When plasma is generated only by the Ar gas, plasma will be a considerably high temperature (10,000K or more).

In the present structure, the length of the opening 8 in the longitudinal direction is larger than the width of the substrate 2. Therefore, the entire thin film 22 close to the surface of the substrate 2 can be processed by one scanning (to relatively move the inductively-coupled plasma torch unit T and the substrate mounting table 1).

A high frequency power of 13.56 MHz is supplied to the coils 3 from the not-shown high-frequency power source while supplying the Ar gas or an Ar+$H_2$ gas as the plasma gas into the chamber 7 and ejecting the gas from the opening 8 toward the substrate 2 in the above plasma processing device, thereby generating a high-frequency electromagnetic field in the chamber 7 to generate the plasma P. The substrate 2 is irradiated by the plasma from the opening 8 and scanned, thereby performing heat treatment such as crystallization of a semiconductor film and so on.

As conditions for generating plasma, appropriate values are approximately: the distance between the opening 8 and the substrate 2=0.1 to 5 mm, scanning speed=20 to 3000 mm/s, the total flow of plasma gas=1 to 100 SLM, $H_2$ density in Ar+$H_2$ gas=0 to 10%, and high frequency power=0.5 to 50 kW. The gas flow and the power in these values show values per a length 100 mm of the opening 8. It is because, it may be suitable that an amount proportional to the length of the opening 8 is inputted concerning parameters such as the gas flow and the power.

As described above, the long chamber 7 and the substrate mounting table 1 are relatively moved in the direction perpendicular to the longitudinal direction of the opening 8 while arranging the longitudinal direction of the opening 8 and the substrate mounting table 1 in parallel to each other, therefore, it is possible to construct the device so that the length of plasma to be generated is substantially equivalent to the length of the substrate 2 to be processed.

According to the embodiment, the wall surface of the first ceramic block contacting high-temperature plasma can be cooled more effectively. Therefore, larger high-frequency power can be inputted, and relative movement can be performed at higher speed for obtaining a desired peak temperature. That is, high-speed processing can be realized at the time of performing high-temperature heat treatment uniformly to the vicinity of the surface of the substrate for a very short period of time, or at the time of performing low-temperature plasma processing to the substrate by irradiating the substrate with plasma by a reactive gas or with plasma and a reactive gas flow at the same time.

Embodiment 2

Hereinafter, Embodiment 2 of the present embodiment will be explained with reference to FIG. 4 and FIG. 5.

Figure 4:
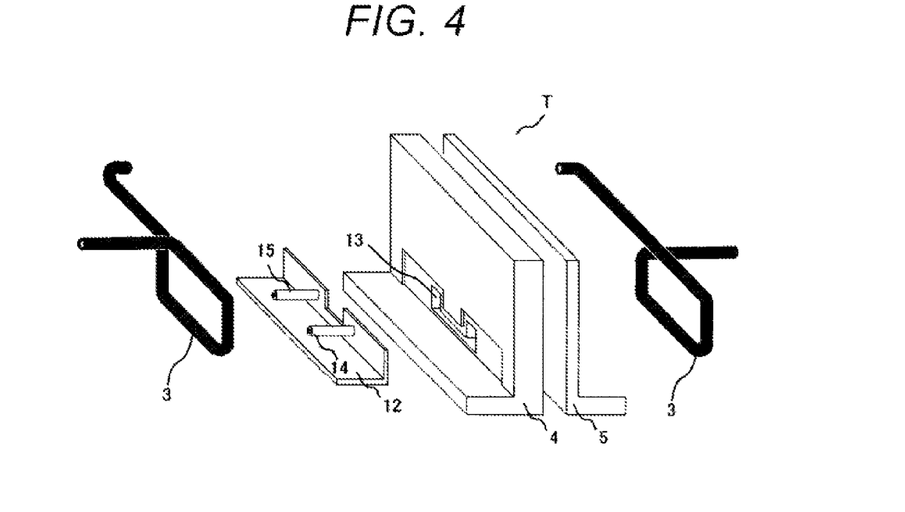
FIG. 4 is a perspective view showing a structure of a plasma processing device according to Embodiment 2 of the present invention.
Figure 5:
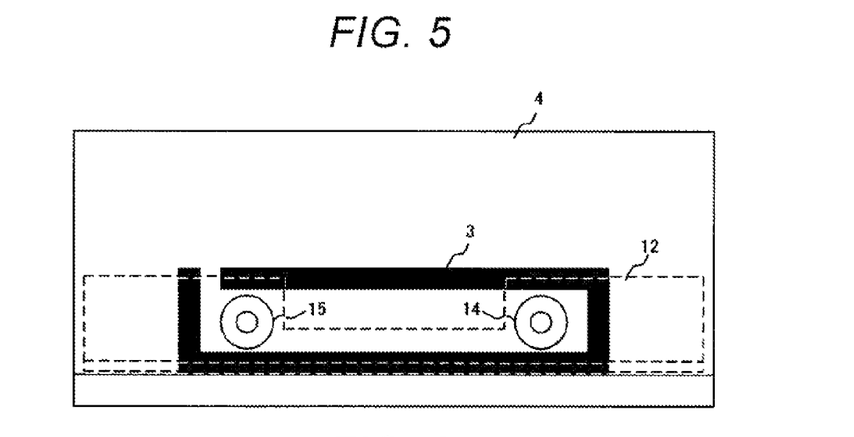
FIG. 5 is a plan view showing the structure of the plasma processing device according to Embodiment 2 of the present invention.

FIG. 4 is an assembly structure view of an inductively-coupled plasma torch unit T according to Embodiment 2 of the present invention, in which perspective views of respective parts (portions) are aligned (corresponds to FIG. 2).

In Embodiment 2, the lid 12 made of the dielectric has an L-shaped portion (forms an L-shape in a cross section taken along a surface perpendicular to the longitudinal direction of the inductively-coupled plasma torch unit T) as shown in FIG. 4. That is, part of the lid 12 is positioned between the coil 3 and the substrate mounting table 1. FIG. 5 is a plan view showing a structure of a plasma processing device according to Embodiment 2 of the present invention, which is obtained by seeing the coil 3 and the first ceramic block 4 from the left side of FIG. 4. An outer periphery of the lid 12 is shown by a dotted line in FIG. 5. As shown in FIG. 5, the refrigerant entrance 14 and the refrigerant exit 15 are connected to both sides of the U-shaped lid 12, which are arranged so as to pierce the inside of an annular region formed by the coil 3. Additionally, the length of the lid 12 is formed to be larger than the length of the coil 3 in the longitudinal direction.

There is a danger that dielectric breakdown occurs and discharge enters a bonding portion between the first ceramic block 4 and the lid 12 in Embodiment 1. However, as the lid 12 is formed in the L-shape in Embodiment 2, a structure in which there is no seam between the chamber 7 and a lower part of the coil 3 (long-side portion close to the opening 8) can be formed, and further, the lid 12 extends to the side outer than the short-side portion of the coil 3, therefore, a structure in which there is no seam between the chamber 7 and the short-side portion of the coil 3 can be also obtained, as a result, the danger that discharge enters the bonding portion is low and the occurrence of abnormal discharge can be suppressed.

Embodiment 3

Hereinafter, Embodiment 3 of the present embodiment will be explained with reference to FIG. 6.

Figure 6:
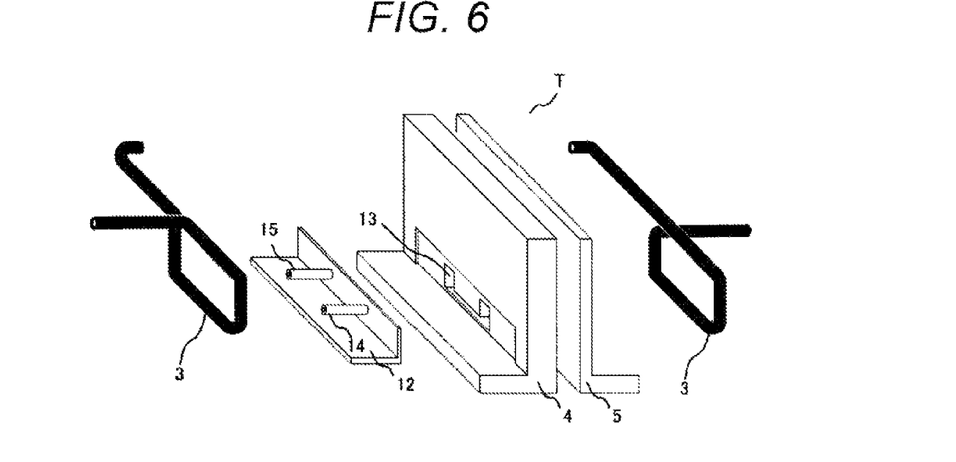
FIG. 6 is a perspective view showing a structure of a plasma processing device according to Embodiment 3 of the present invention.

FIG. 6 is an assembly structure view of the inductively-coupled plasma torch unit T according to Embodiment 3 of the present invention, in which perspective views of respective parts (portions) are aligned (corresponds to FIG. 2).

In FIG. 6, the refrigerant flow path 13 has the U-shape in the same manner as Embodiments 1 and 2, however, the lid 12 does not have the U-shape, and a bonding surface of a portion for closing the refrigerant flow path 13 has a rectangular shape. Such structure can be applied.

Embodiment 4

Hereinafter, Embodiment 4 of the present embodiment will be explained with reference to FIG. 7 and FIG. 8.

Figure 7:
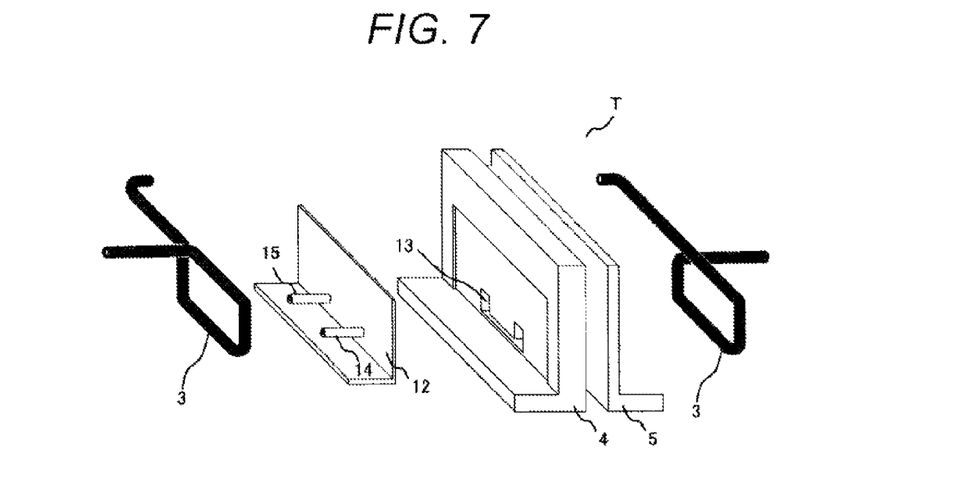
FIG. 7 is a perspective view showing a structure of a plasma processing device according to Embodiment 4 of the present invention.

FIG. 7 is an assembly structure view of an inductively-coupled plasma torch unit T according to Embodiment 4 of the present invention, in which perspective views of respective parts (portions) are aligned (corresponds to FIG. 2). FIG. 8 is a plan view showing a structure of a plasma processing device according to Embodiment 4 of the present invention, which is obtained by seeing the coil 3 and the first ceramic block 4 from the left side of FIG. 7. An outer periphery of the lid 12 is shown by a dotted line in FIG. 8.

Figure 8:
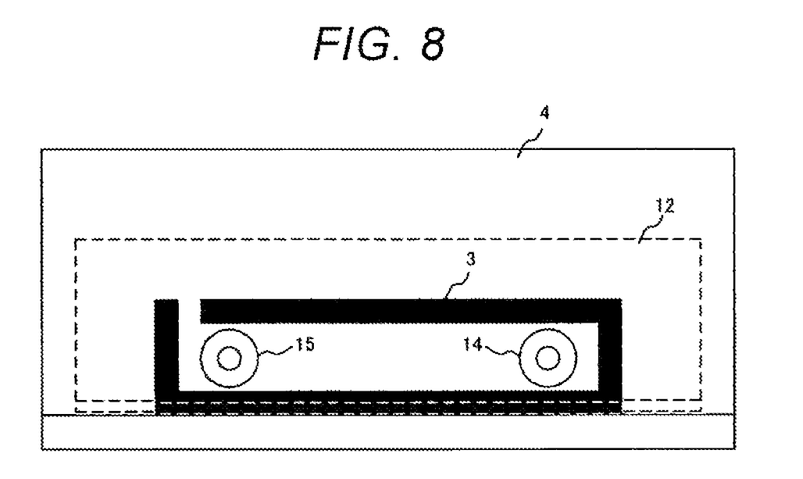
FIG. 8 is a plan view showing the structure of the plasma processing device according to Embodiment 4 of the present invention.

As shown in FIG. 7 and FIG. 8, the lid 12 is longer than the length of the coil 3 in the longitudinal direction, and the lid 12 is also longer than the length of the coil 3 in a direction perpendicular to the longitudinal direction of the coil 3 in Embodiment 4. That is, an area of the first ceramic block 4 covered by the lid 12 is larger than an area of the first ceramic block 4 covered by the coil 3.

According to the above structure, the structure without a seam between the chamber 7 and all portions of the coil 3 can be obtained, therefore, there is no danger that discharge enters the bonding portion and the occurrence of abnormal discharge can be suppressed.

Embodiment 5

Hereinafter, Embodiment 5 of the present embodiment will be explained with reference to FIGS. 9A and 9B.

Figure 9A:
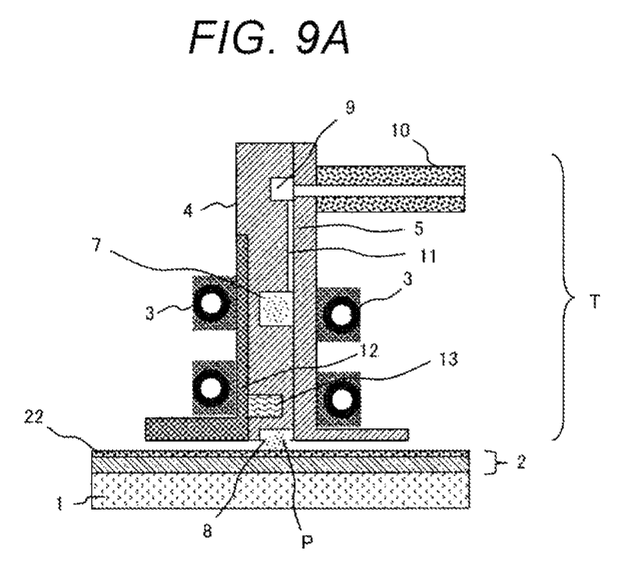
FIGS. 9A and 9B are cross-sectional views showing a structure of a plasma processing device according to Embodiment 5 of the present invention.
Figure 9B:
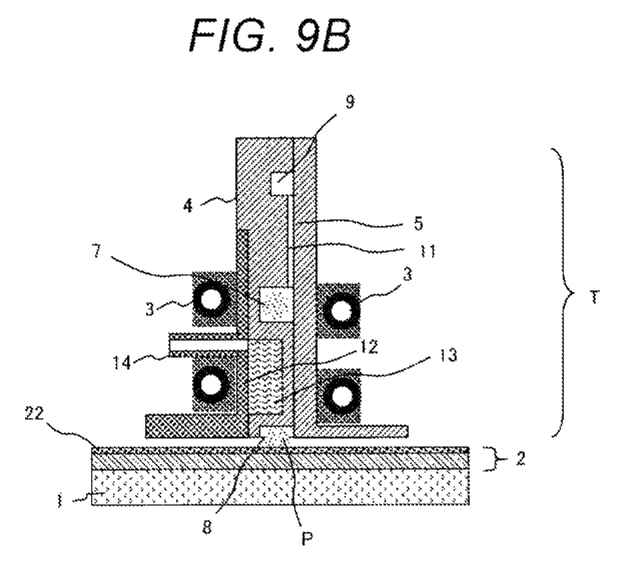

FIGS. 9A and 9B show a structure of a plasma processing device according to Embodiment 5 of the present invention, which are cross-sectional views taken along a surface perpendicular to the longitudinal direction of a long inductively-coupled plasma torch unit, respectively corresponding to FIG. 1A and FIG. 1B.

In FIGS. 9A and 9B, the lid 12 having the L-shape portion is extended from a lower portion of the coil 3 (long side portion close to the opening 8) to directly above the substrate 2, and part of the first ceramic block 4 is not disposed between the lid 12 and the substrate mounting table 1 (it is disposed in Embodiments 1 to 4). This structure can be also applied.

Embodiment 6

Hereinafter, Embodiment 6 of the present embodiment will be explained with reference to FIG. 10.

Figure 10:
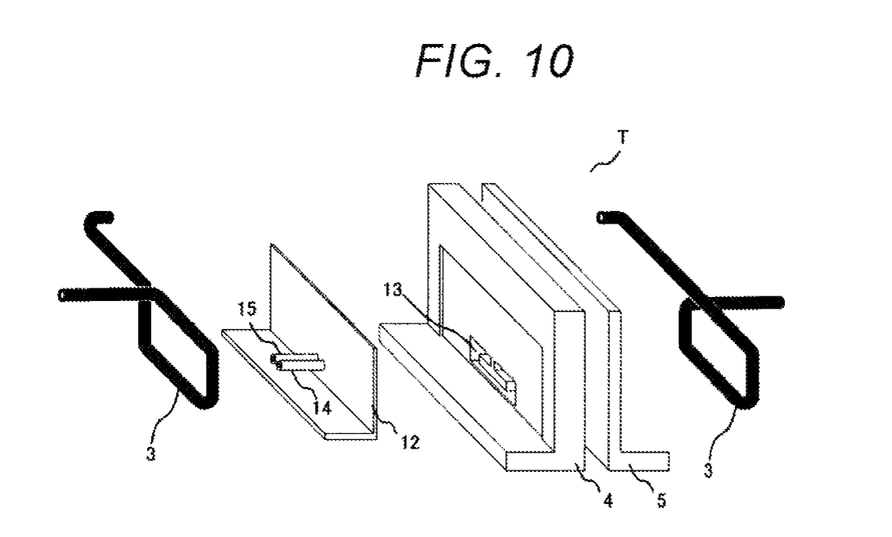
FIG. 10 is a perspective view showing a structure of a plasma processing device according to Embodiment 6 of the present invention.

FIG. 10 is an assembly structure view of an inductively-coupled plasma torch unit T according to Embodiment 6 of the present invention, in which perspective views of respective parts (portions) are aligned (corresponds to FIG. 2).

In FIG. 10, the refrigerant flow path 13 is formed in a C-shape (an annular shape with a gap at an upper part in the drawing), not in the U-shape.

According to the above structure, cooling efficiency can be increased over the entire circumference of the chamber 7.

Embodiment 7

Hereinafter, Embodiment 7 of the present embodiment will be explained with reference to FIGS. 11A and 11B to FIG. 14.

Figure 11A:
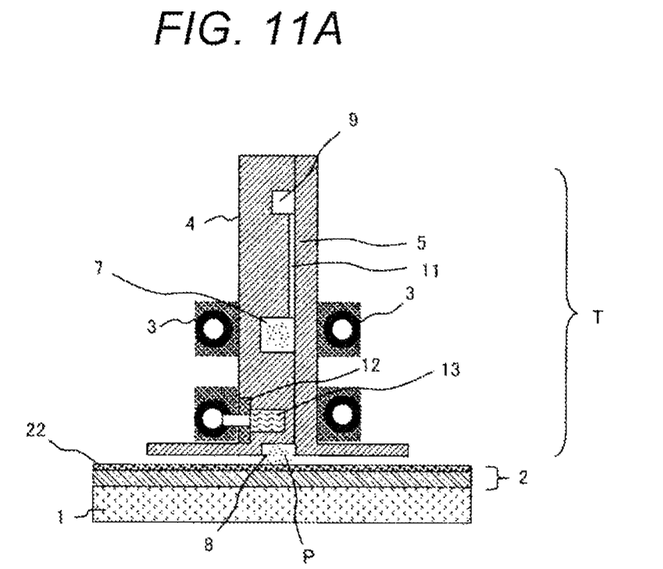
FIGS. 11A and 11B are cross-sectional views showing a structure of a plasma processing device according to Embodiment 7 of the present invention.
Figure 11B:
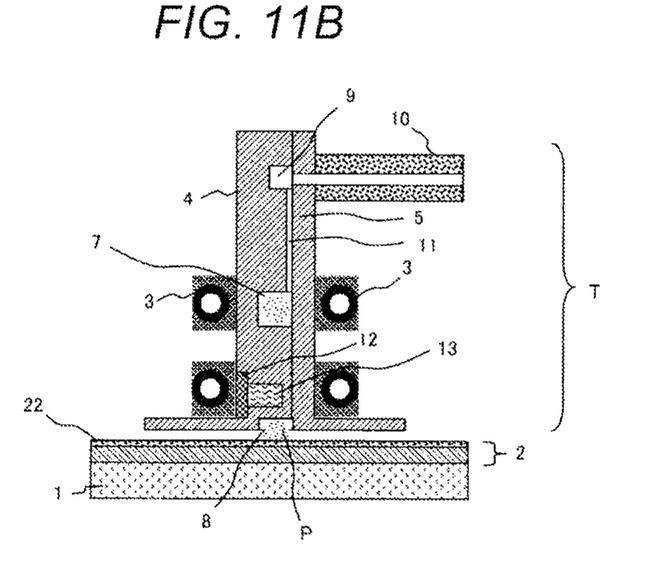
Figure 12:
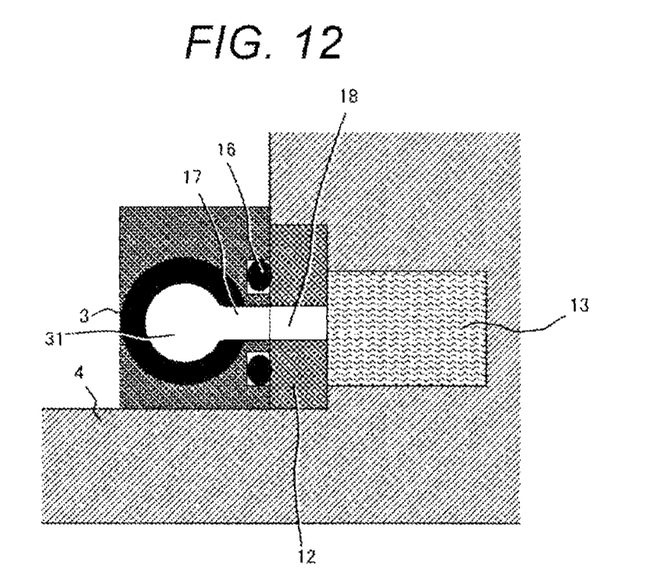
FIG. 12 is a cross-sectional view showing a structure of the plasma processing device according to Embodiment 7 of the present invention.
Figure 13:
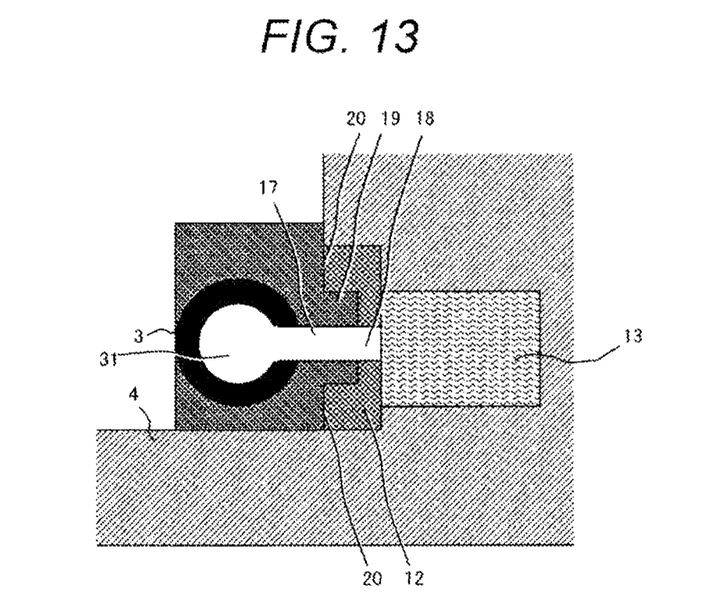
FIG. 13 is a cross-sectional view showing a structure of the plasma processing device according to Embodiment 7 of the present invention.
Figure 14:
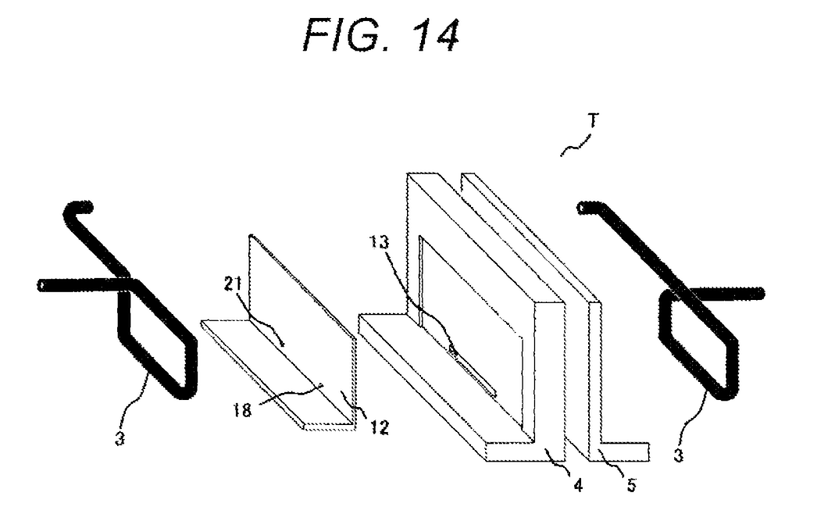
FIG. 14 is a perspective view showing a structure of the plasma processing device according to Embodiment 7 of the present invention.

FIGS. 11A and 11B show a structure of a plasma processing device according to Embodiment 7 of the present invention, which are cross-sectional views taken along a surface perpendicular to the longitudinal direction of a long inductively-coupled plasma torch unit, respectively corresponding to FIGS. 1A and 1B. FIG. 12 and FIG. 13 are enlarged views showing the vicinity of the lid 12 of FIG. 11A. FIG. 14 is an assembly structure view of the inductively-coupled plasma torch unit T, in which perspective views of respective parts (portions) are aligned (corresponds to FIG. 2).

In FIGS. 11A, 11B, FIG. 12 and FIG. 14, the refrigerant flow path 13 is formed in a straight line. The coil 3 is provided with a communicating hole 17 as an entrance/exit for a refrigerant flowing in an inner space 31, which is positioned with through holes 18 and 21 provided in the lid 12, and the coil 3 is bonded to the lid 12. An O-ring 16 is provided around the communicating hole 17 for securing airtightness between the coil 3 and the lid 12. The O-ring 16 is not necessary in the case where airtightness can be sufficiently secured by an adhesive.

As shown in FIG. 13, it is also preferable to apply a structure in which a convex protruding portion 19 is formed around the communicating hole 17 of the coil 3 to be inserted into a counterbored portion provided in the lid 12. In this case, it is possible to reduce infiltration of the adhesive to a tip portion of the protruding portion 19 when the bonding is performed by using the adhesive applied to a surface 20 which does not protrude or an opposite surface thereof in bonding surfaces of the coil 3, therefore, a failure of blocking the communicating hole 17 and the through hole 18 by the adhesive can be suppressed.

In the embodiment, the refrigerant flow path provided inside the coil 3 diverges to be communicated to the refrigerant flow path 13 provided inside the first ceramic block 4. A simple refrigerant piping system can be constructed by applying the above structure.

The plasma processing devices and the plasma processing methods described above are just typical examples in the application range of the present invention.

For example, the inductively-coupled plasma torch unit T may be scanned with respect to the fixed substrate mounting table 1 as well as the substrate mounting table 1 may be scanned with respect to the fixed inductively-coupled plasma torch unit T.

Various structures of the present invention enable high-temperature processing to the vicinity of the surface of the substrate 2. Accordingly, the present invention can be applied to not only crystallization of a semiconductor film for TFT and improvement of a semiconductor film for a solar cell described in related-art examples but also various surface processing such as clean-up of a protective layer of a plasma display panel, the reduction of degassing, the surface planarization and the reduction of degassing of a dielectric layer made of an aggregation of silica particles, the reflow of various electronic devices, and plasma doping using a solid impurity source. The present invention can be also applied to a method of manufacturing solar cells, in which powder obtained by crushing a silicon ingot is applied on the substrate to be irradiated with plasma and melted to thereby obtain a polycrystalline silicon film.

It is also possible to use an ignition source for facilitating the ignition of plasma. As the ignition source, a sparking apparatus for ignition used for a gas water heater and so on can be applied.

The word "thermal plasma" is used in the explanation for simplification, however, it is strictly difficult to distinguish between thermal plasma and low-temperature plasma. It is also difficult to distinguish types of plasma only based on the thermal equilibria, for example, as commented in "Non-equilibria of thermal plasma" by TANAKA Yasunori in a journal of plasma and fusion research Vol. 82, NO. 8 (2006) pp. 479-483. An object of the present invention is to perform heat treatment to the substrate, and the present invention can be applied to the technique of irradiating high-temperature plasma regardless of words such as thermal plasma, thermal equilibria plasma and high-temperature plasma.

Though the case where high-temperature heat treatment is performed uniformly to the vicinity of the surface of the substrate for a very short period of time has been explained in detail as an example, the present invention can be also applied to the case where low-temperature plasma processing is performed to the substrate by irradiating the substrate with plasma by a reactive gas or with plasma and the reactive gas flow at the same time. The substrate is irradiated with plasma by the reactive gas by mixing the reactive gas into the plasma gas to realize etching or CVD.

Alternatively, when a gas including a reactive gas as a shielding gas is supplied while using a noble gas or a gas obtained by adding a small amount of $H_2$ gas to the noble gas as a plasma gas, thereby irradiating the substrate with plasma and the reactive gas flow at the same time and realizing plasma processing such as etching, CVD and doping. When using the gas mainly containing argon as a plasma gas, thermal plasma is generated as explained in the embodiments in detail.

On the other hand, when using a gas mainly containing helium as a plasma gas, relatively low-temperature plasma can be generated. It is possible to perform processing such as etching and film deposition without heating the substrate by using the above method. As reactive gases used for etching, there are halogen-containing gases such as $C_xF_y$ (x and y are natural numbers) and $SF_6$, whereby performing etching of silicon, silicon compounds and the like. When using $O_2$ as a reactive gas, removal of organic matters, resist ashing and so on can be performed. As reactive gases used for CVD, there are monosilane, disilane and so on, whereby performing depositing of silicon and silicon compounds.

Alternatively, when using a mixed gas of an organic gas containing silicon represented by TEOS (Tetraethoxysilane) and $O_2$, a silicon oxide film can be deposited. Other various low-temperature plasma processing such as surface processing for improving water repellency and hydrophilia can be performed. As the present technique relates to the inductively-coupled type device, the arc discharge does not easily occur even when higher power density per a unit volume is inputted as well as higher density plasma can be generated as compared with the related art technique using capacitive-coupled atmospheric plasma, as a result, higher reaction speed can be obtained and a desired region to be processed in the substrate can be entirely processed efficiently for a short period of time.

As described above, the present invention can be applied to crystallization of the semiconductor film for TFT and improvement of the semiconductor film for a solar cell. The present invention is useful, which is capable of performing high-speed processing at the time of performing high-speed heat treatment uniformly to the vicinity of the surface of the substrate for a very short period of time in various surface processing such as clean-up of a protective layer of a plasma display panel, the reduction of degassing, the surface planarization and the reduction of degassing of a dielectric layer made of an aggregation of silica particles, the reflow of various electronic devices, and plasma doping using a solid impurity source.

The present invention is also useful, which is capable of processing the entire desired region to be processed in the substrate for a short period of time efficiently in low-temperature plasma processing such as etching, deposition, doping, surface improvement and so on in the manufacture of various electronic devices.

What is claimed is:

1. A plasma processing device which uses an inductively-coupled plasma torch, comprising:
    a long annular chamber surrounded by a dielectric member;
    an opening communicated to the chamber;
    a gas supply pipe for introducing gas into the chamber;
    a coil provided in parallel to a surface formed by the chamber;
    a high-frequency power source connected to the coil; and
    a substrate mounting table,
    wherein the chamber is provided along a surface perpendicular to a surface formed by the substrate mounting table, and a refrigerant flow path is provided inside the dielectric member inside the chamber, and
    wherein the chamber has a closed continuous string shape.

2. The plasma processing device according to claim 1, wherein a movement mechanism is provided, which is capable of moving the chamber and the substrate mounting table relatively to a direction perpendicular to a longitudinal direction of the chamber.

3. The plasma processing device according to claim 1, wherein a refrigerant entrance and a refrigerant exit with respect to the refrigerant flow path are provided inside the coil.

4. The plasma processing device according to claim 1, wherein the refrigerant flow path is surrounded by a groove provided in the dielectric member and a dielectric lid covering the groove, and an area of the dielectric member covered by the dielectric lid is larger than an area of the dielectric member covered by the coil.

5. The plasma processing device according to claim 1, wherein the refrigerant flow path is surrounded by a groove provided in the dielectric member and a dielectric lid covering the groove, the dielectric lid includes an L-shaped portion, and part of the dielectric lid is positioned between the coil and the substrate mounting table.

6. The plasma processing device according to claim 1, wherein the inside of the coil is formed to be a refrigerant flow path, and the refrigerant flow path provided inside the coil diverges to be communicated to the refrigerant flow path provided inside the dielectric member.

7. The plasma processing device according to claim 6, wherein the refrigerant flow path is surrounded by a groove provided in the dielectric member and a dielectric lid covering the groove, and the refrigerant flow path provided inside the coil and the refrigerant flow path provided inside the dielectric member are communicated to each other through a through hole provided in the dielectric lid.

8. A plasma processing method ejecting a gas toward a substrate from an opening communicated to a chamber while supplying the gas into a long annular chamber provided along a surface perpendicular to a surface formed by a substrate mounting table and surrounded by a dielectric member and generating a high-frequency electromagnetic field in the chamber by supplying high-frequency power to a coil provided in parallel to a surface formed by the chamber to thereby generate inductively-coupled plasma to process a surface of the substrate, the method comprising the step of:

processing the substrate while allowing a refrigerant to flow in a refrigerant flow path provided inside the dielectric member inside the chamber, wherein the chamber has a closed continuous string shape.

\* \* \* \* \*